(12) United States Patent
Brunner et al.

(10) Patent No.: US 11,356,059 B2
(45) Date of Patent: Jun. 7, 2022

(54) FLEXIBLE LISSAJOUS SCANNING PATTERN BY PHASE MODULATION

(71) Applicant: Infineon Technologies AG, Neubiberg (DE)

(72) Inventors: David Brunner, Dobersberg (AT); Georg Schitter, Vienna (AT); Richard Schroedter, Dresden (AT); Han Woong Yoo, Vienna (AT)

(73) Assignee: Infineon Technologies AG

( * ) Notice: Subject to any disclaimer, the term of this patent is extended or adjusted under 35 U.S.C. 154(b) by 232 days.

(21) Appl. No.: 16/861,647

(22) Filed: Apr. 29, 2020

(65) Prior Publication Data

US 2021/0344302 A1 Nov. 4, 2021

(51) Int. Cl.
*H03B 5/30* (2006.01)
(52) U.S. Cl.
CPC ..................................... *H03B 5/30* (2013.01)
(58) Field of Classification Search
CPC ....................................................... H03B 5/30
See application file for complete search history.

(56) References Cited

U.S. PATENT DOCUMENTS

2008/0239445 A1\* 10/2008 Ando .................. G02B 26/105
359/224.1

\* cited by examiner

*Primary Examiner* — Jeffrey M Shin
(74) *Attorney, Agent, or Firm* — Design IP

(57) ABSTRACT

An oscillator system includes a first oscillator structure configured to oscillate about a first rotation axis at a first oscillation frequency; a second oscillator structure configured to oscillate about a second rotation axis at a second oscillation frequency; a driver circuit configured to generate a first driving signal to drive an oscillation of the first oscillator structure with a first oscillation phase and the first oscillation frequency and generate a second driving signal to drive an oscillation of the second oscillator structure with a second oscillation phase and the second oscillation frequency. The first oscillation frequency and the second oscillation frequency have a variable frequency ratio with respect to each other that varies over time. The driver circuit is configured to modulate at least one of the first oscillation phase or the second oscillation phase to modulate the variable frequency ratio.

35 Claims, 6 Drawing Sheets

FLEXIBLE LISSAJOUS SCANNING PATTERN BY PHASE MODULATION

BACKGROUND

Light Detection and Ranging (LIDAR), is a remote sensing method that uses light in the form of a pulsed laser to measure ranges (variable distances) to one or more objects in a field of view. In particular, a microelectromechanical system (MEMS) mirror is used to scan light across the field of view. Arrays of photodetectors receive reflections from objects illuminated by the light, and the time it takes for the reflections to arrive at various sensors in the photodetector array is determined. This is also referred to as measuring time-of-flight (TOF). LIDAR systems form depth measurements and make distance measurements by mapping the distance to objects based on the time-of-flight computations. Thus, the time-of-flight computations can create distance and depth maps, which may be used to generate images.

Lissajous scanning is typically done by two resonant scanning axes which are each driven at constant scanning frequency with a defined frequency ratio/difference therebetween that forms a specific Lissajous pattern and frame rate. The result is a Lissajous scanning pattern that has a low resolution at the center and high resolution at the edges of the field of view. A higher resolution can only be obtained by reducing the frequency difference, by using special frequency selection rules that typically requires a large difference between both scanning frequencies or by using a concept of sub-framing. However, reducing the frequency difference results in a lower frame rate and sub-framing combines new data and old data by assuming that neighboring pixels are not fast changing, which is not always the case.

Additionally, due to the high symmetry of the Lissajous pattern, each quadrant in an X-Y plane (i.e., an X-Y field of view plane) has identical properties. However, it may be desirable for some applications, such as object tracking, to have higher resolution or a different pixel distribution in dedicated quadrants.

Therefore, an improved system that enables flexible Lissajous scanning with configurable Lissajous patterns and configurable regions-of-interest (ROI) of different resolutions may be desirable.

SUMMARY

One or more embodiments provide an oscillator system, including: a first oscillator structure configured to oscillate about a first rotation axis at a first oscillation frequency; a second oscillator structure configured to oscillate about a second rotation axis at a second oscillation frequency; and a driver circuit configured to generate a first driving signal to drive an oscillation of the first oscillator structure with a first oscillation phase and the first oscillation frequency and generate a second driving signal to drive an oscillation of the second oscillator structure with a second oscillation phase and the second oscillation frequency. The first oscillation frequency and the second oscillation frequency have a variable frequency ratio with respect to each other that varies over time. The driver circuit is configured to modulate at least one of the first oscillation phase or the second oscillation phase to modulate the variable frequency ratio.

One or more embodiments provide a method of controlling an oscillator system, including: driving a first oscillator structure to oscillate about a first rotation axis at a first oscillation frequency; driving a second oscillator structure to oscillate about a second rotation axis at a second oscillation frequency; generating a first driving signal to drive an oscillation of the first oscillator structure with a first oscillation phase and the first oscillation frequency; generating a second driving signal to drive an oscillation of the second oscillator structure with a second oscillation phase and the second oscillation frequency, wherein the first oscillation frequency and the second oscillation frequency have a variable frequency ratio with respect to each other that varies over time; and modulating at least one of the first oscillation phase or the second oscillation phase to modulate the variable frequency ratio.

One or more embodiments provide an oscillator system, including: an oscillator structure configured to oscillate about a first rotation axis at a first oscillation frequency and oscillate about a second rotation axis at a second oscillation frequency; a driver circuit configured to generate a first driving signal to drive a first oscillation of the oscillator structure about the first rotation axis with a first oscillation phase and the first oscillation frequency, and generate a second driving signal to drive a second oscillation of the oscillator structure about the second rotation axis with a second oscillation phase and the second oscillation frequency. The first oscillation frequency and the second oscillation frequency have a variable frequency ratio with respect to each other that varies over time. The driver circuit is configured to modulate at least one of the first oscillation phase or the second oscillation phase to modulate the variable frequency ratio.

One or more embodiments provide a method of controlling an oscillator structure, including: driving the oscillator structure to oscillate about a first rotation axis at a first oscillation frequency and to oscillate about a second rotation axis at a second oscillation frequency; generating a first driving signal to drive a first oscillation of the oscillator structure about the first rotation axis with a first oscillation phase and the first oscillation frequency; generating a second driving signal to drive a second oscillation of the oscillator structure about the second rotation axis with a second oscillation phase and the second oscillation frequency, wherein the first oscillation frequency and the second oscillation frequency have a variable frequency ratio with respect to each other that varies over time; and modulating at least one of the first oscillation phase or the second oscillation phase to modulate the variable frequency ratio.

BRIEF DESCRIPTION OF THE DRAWINGS

Embodiments are described herein making reference to the appended drawings.

DETAILED DESCRIPTION

Figure 1:
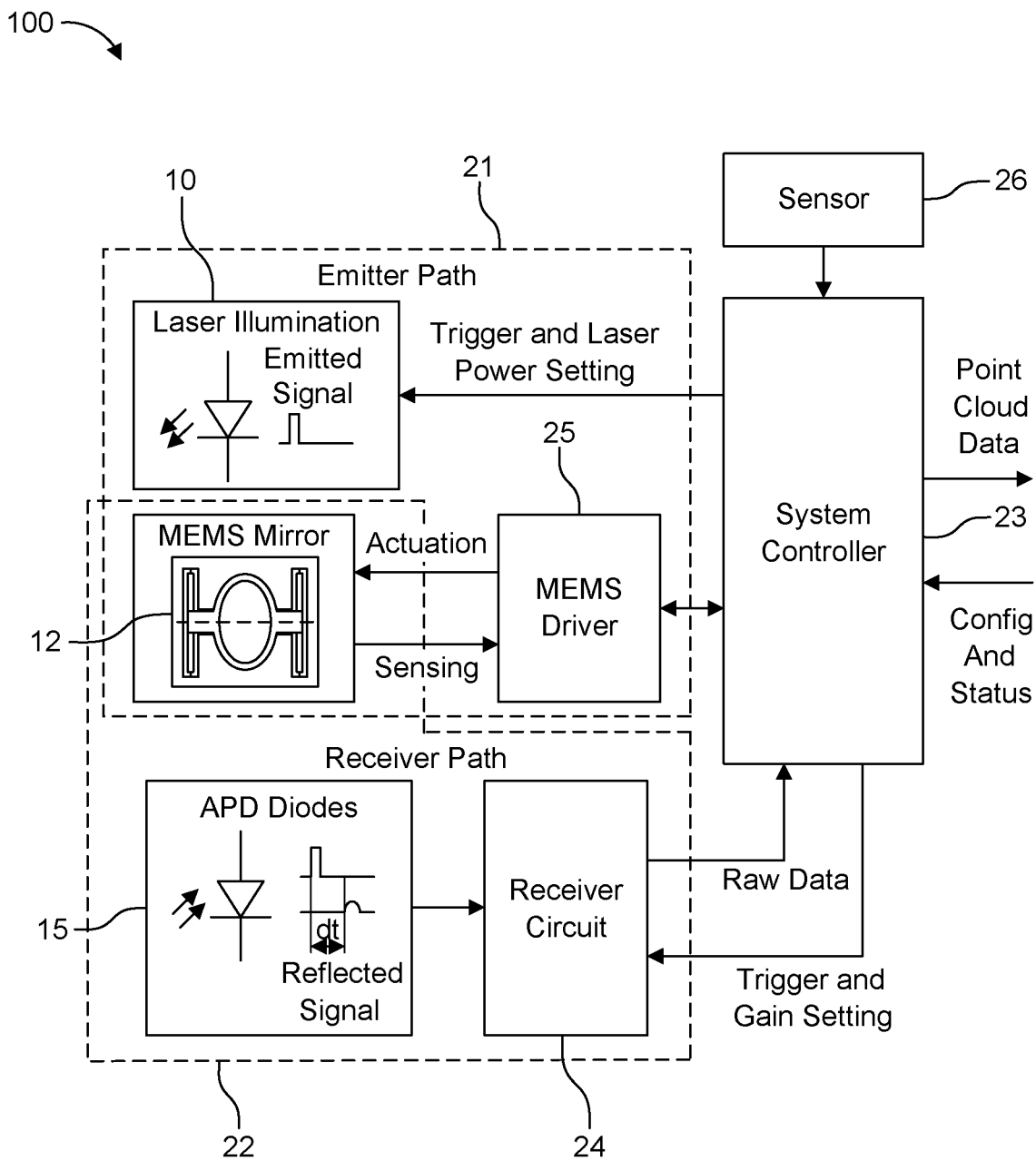
FIG. 1 is a schematic block diagram of a LIDAR scanning system in accordance with one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photons of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

In Light Detection and Ranging (LIDAR) systems, a light source transmits light pulses into a field of view and the light reflects from one or more objects by backscattering. In particular, LIDAR is a direct Time-of-Flight (TOF) system in which the light pulses (e.g., laser beams of infrared light) are emitted into the field of view, and a pixel array detects and measures the reflected beams. For example, an array of photodetectors receives reflections from objects illuminated by the light.

Differences in return times for each light pulse across multiple pixels of the pixel array can then be used to make digital 3D representations of an environment or to generate other sensor data. For example, the light source may emit a single light pulse, and a time-to-digital converter (TDC) electrically coupled to the pixel array may count from the time the light pulse is emitted, corresponding to a start signal, until a time the reflected light pulse is received at the receiver (i.e., at the pixel array), corresponding to a stop signal. The "time-of-flight" of the light pulse is then translated into a distance.

In another example, an analog-to-digital converter (ADC) may be electrically coupled to the pixel array (e.g., indirectly coupled with intervening elements in-between) for pulse detection and ToF measurement. For example, an ADC may be used to estimate a time interval between start/stop signals with an appropriate algorithm. For example, an ADC may be used detect an analog electrical signal from one or more photodiodes to estimate a time interval between a start signal (i.e., corresponding to a timing of a transmitted light pulse) and a stop signal (i.e., corresponding to a timing of receiving an analog electrical signal at an ADC) with an appropriate algorithm.

A scan, such as an oscillating horizontal scan (e.g., from left to right and right to left of a field of view), an oscillating vertical scan (e.g., from bottom to top and top to bottom of a field of view), or a Lissajous scan (e.g., according to a Lissajous scanning pattern that employs two scanning axes) can illuminate a scene in a continuous scan fashion. By emitting successive light pulses in different scanning directions, an area referred to as the field of view can be scanned and objects within the area can be detected and imaged. Thus, the field of view represents a scanning plane having a center of projection. A raster scan or omnidirectional scanning could also be used.

FIG. 1 is a schematic block diagram of a LIDAR scanning system 100 in accordance with one or more embodiments. The LIDAR scanning system 100 includes a transmitter unit 21 that is responsible for an emitter path of the system 100, and a receiver unit 22 that is responsible for a receiver path of the system 100. The system also includes a system controller 23 that is configured to control components of the transmitter unit 21 and the receiver unit 22, and to receive raw data from the receiver unit 22 and perform processing thereon (e.g., via digital signal processing) for generating object data (e.g., point cloud data). Thus, the system controller 23 includes at least one processor and/or processor circuitry (e.g., comparators, TDCs, ADCs, and digital signal processors (DSPs)) of a signal processing chain for processing data, as well as control circuitry, such as a microcontroller, that is configured to generate control signals. The LIDAR scanning system 100 may also include a sensor 26, such as a temperature sensor, that provides sensor information to the system controller 23.

The transmitter unit 21 includes an illumination unit 10, a MEMS mirror 12, and a MEMS driver 25 configured to drive the MEMS mirror 12. In particular, the MEMS driver 25 actuates and senses the rotation position of the mirror, and provides position information (e.g., tilt angle or degree of rotation about the rotation axis) of the mirror to the system controller 23. Based on this position information, the laser sources of the illumination unit 10 are triggered by the system controller 23 and the photodiodes are activated to sense, and thus measure, a reflected light signal. Thus, a higher accuracy in position sensing of the MEMS mirror results in a more accurate and precise control of other components of the LIDAR system.

A drive voltage (i.e., an actuation or driving signal) is applied by the MEMS driver 25 to an actuator structure of the MEMS mirror 12 to driver the oscillation of the MEMS mirror 12. The drive voltage may be referred to as a high-voltage (HV). The actuator structure may include interdigitated finger electrodes made of interdigitated mirror combs and frame combs to which a drive voltage (i.e., an actuation or driving signal) is applied by the MEMS driver 25. The drive voltage applied to the actuator structure creates a driving force between, for example, interdigitated mirror combs and the frame combs, which creates a torque on the mirror body about the rotation axis. The drive voltage can be switched or toggled on and off (HV on/off) resulting in an oscillating driving force. The oscillating driving force causes the mirror to oscillate back and forth on its rotation axis between two extrema. The drive voltage may be a constant drive voltage, meaning that the drive voltage is the same voltage when actuated (i.e., toggled on). However, it will be understood that the drive voltage is being toggled on and off in order to produce the mirror oscillation. Depending on the configuration, this actuation can be regulated or adjusted by adjusting the drive voltage off time, a voltage level of the drive voltage, or a duty cycle.

In other embodiments, an electromagnetic actuator may be used to drive the MEMS mirror 12. For an electromagnetic actuator, a driving current (i.e., an actuation or driving signal) may be used to generate the oscillating driving force. Thus, it will be appreciated that drive/driving voltage and drive/driving current may be used interchangeably herein to indicate an actuation signal or a driving signal, and both may generally be referred to as a driving force.

As the mirror oscillates, the capacitance between the finger electrodes changes according to the mirror's rotation position. The MEMS driver 25 is configured to measure the capacitance between the interdigitated finger electrodes, and determine a rotation position or angle position of the MEMS mirror 12 therefrom. By monitoring the capacitance, the MEMS driver 25 can detect the zero-crossing events and a timing thereof, and can determine the tilt angle of the MEMS mirror 12 at any given moment. The MEMS driver 25 can also use the measured capacitance to determine a mirror frequency, and record the information in memory at the MEMS driver 25 or at the system controller 23.

The sensing of the position of the MEMS mirror 12 is performed based on a detector that is configured to measure the capacitance. For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific position (i.e., tilt angle) of the MEMS mirror. By sensing the capacitance of the finger structure, the MEMS driver 25 can monitor and track the oscillations of the mirror, and determine a specific position of the MEMS mirror, including the zero-crossing.

One way to measure the capacitance is to measure a current flowing through the finger structure, convert the measured current into a voltage, and then further correlate the voltage to a capacitance and/or a rotation angle. However, any method to measure the capacitance may be used. A rotation direction (e.g., positive or negative, left-to-right or right-to-left, clockwise or counter-clockwise, etc.) is also detected by measuring a change in capacitance over time, where a positive or a negative change indicates opposing rotation directions. The MEMS driver 25 can also record the currents and voltages measured during the measuring of the capacitance. Thus, increasing the accuracy of position sensing of the mirror may improve the overall accuracy of the LIDAR system.

Since the mirror is driven at an oscillation frequency (e.g., 2 kHz), when the mirror rotates in a first rotation direction (e.g., left-to-right or clockwise), it crosses a zero position (i.e., 0°) at a certain point of time. The same can be said when the mirror rotates in a second rotation direction (e.g., right-to-left or counter-clockwise), the mirror will cross the zero position at a certain point in time. These instances of crossing the zero position may be referred to as zero-crossing events which occur at zero-crossing times.

The MEMS mirror 12 is a mechanical moving mirror (i.e., a MEMS micro-mirror) integrated on a semiconductor chip (not shown). The MEMS mirror 12 according to this embodiment is configured to rotate about either a single scanning axis (i.e., a 1D MEMS mirror) or two scanning axes (i.e., a 2D MEMS mirror) that are typically orthogonal to each other. As a 2D MEMS mirror, the MEMS mirror 12 may be a Lissajous scanner that is configured to control the steering of the laser beams in two dimensions (e.g., in horizontal and vertical directions).

It will be further appreciated that a LIDAR scanning system may include multiple scanning mirrors 12 in a Lissajous scanning system (i.e., a 2×1D system), where a first 1D MEMS mirror has a single scanning axis for steering a light beam in a horizontal scanning direction and a second 1D MEMS mirror has a single scanning axis for steering the light beam in a vertical scanning direction. Thus, the two MEMS mirrors in a Lissajous scanning system are mounted at a same location in a vehicle, for example, and are configured to scan a same field of view.

Hence, a transmission technique includes transmitting the beams of light into the field of view from a transmission mirror that continuously oscillates about one or more scanning axes such that the beams of light are projected into the field of view that moves across the field of view as the transmission mirror changes the transmission direction. One or more embodiments may use two resonant scanning axes.

In the event that line scanners are used, the scanning pattern may not be a Lissajous pattern, but instead may generate a different type of pattern. Thus, the embodiments provided herein are not limited to a Lissajous scanning system.

Upon impinging one or more objects, the transmitted light is reflected by backscattering back towards the LIDAR scanning system 100 as reflected light. As will be described in more detail below, the MEMS mirror 12 receives the reflected light and directs the reflected light onto a photodetector 15 via a beam splitter device. The photodetector 15 receives the reflected light and is configured to generate electrical measurement signals. The electrical measurement signals may be used by the systems controller 23 for generating a 3D map of the environment and/or other object data based on the reflected light (e.g., via TOF calculations and processing).

The receiver unit 22 includes the MEMS mirror 12, the photodetector 15, as well as a receiver circuit 24 that includes an analog readout circuit that is configured to read out measurement signals received from the photodetector 15. The same MEMS mirror may be shared for the transmitter and the receiver. Alternatively, the transmitter and the receiver may use different MEMS mirrors. Alternatively, only the transmitter has a MEMS mirror while the receiver is non-scanning.

The photodetector 15 can be any of a number of photodetector types; including avalanche photodiodes (APD), photocells, and/or other photodiode devices. Imaging sensors such as charge-coupled devices (CCDs) can be the photodetectors. In the examples provided herein, the photodetector 15 may be a single pixel photodetector (e.g., a single APD), a 1D APD array that comprises an array of APD pixels arranged in one dimension, or a two-dimensional (2D) APD array that comprises an array of APD pixels arranged in two dimensions. As noted above, the photodetector 15 may be a 1D array that includes a single column of photodiodes. The system controller 23 may synchronize the activation of the photodiodes with light pulses emitted by the illumination unit 10.

The photodetector 15 receives reflective light pulses as the receiving line RL and generates electrical signals in response thereto. Since the time of transmission of each light pulse from the illumination unit 10 is known, and because the light travels at a known speed, a time-of-flight computation using the electrical signals can determine the distance of objects from the photodetector 15. A depth map can plot the distance information.

The receiver circuit 24 may receive the analog electrical signals from the photodetectors of the photodetector 15 and transmit the electrical signals as raw analog data to the system controller 23 for processing. The receiver circuit 24 may also receive trigger control signals from the system controller 23 that triggers an activation of one or more photodetectors. The receiver circuit 24 may also receive gain setting control signals for controlling the gain of one or more photodetectors.

The system controller 23 uses the received data to calculate time-of-flight information for each field position within the field of view, to generate object data (e.g., point cloud data), and to generate a 3D point cloud.

Figure 2:
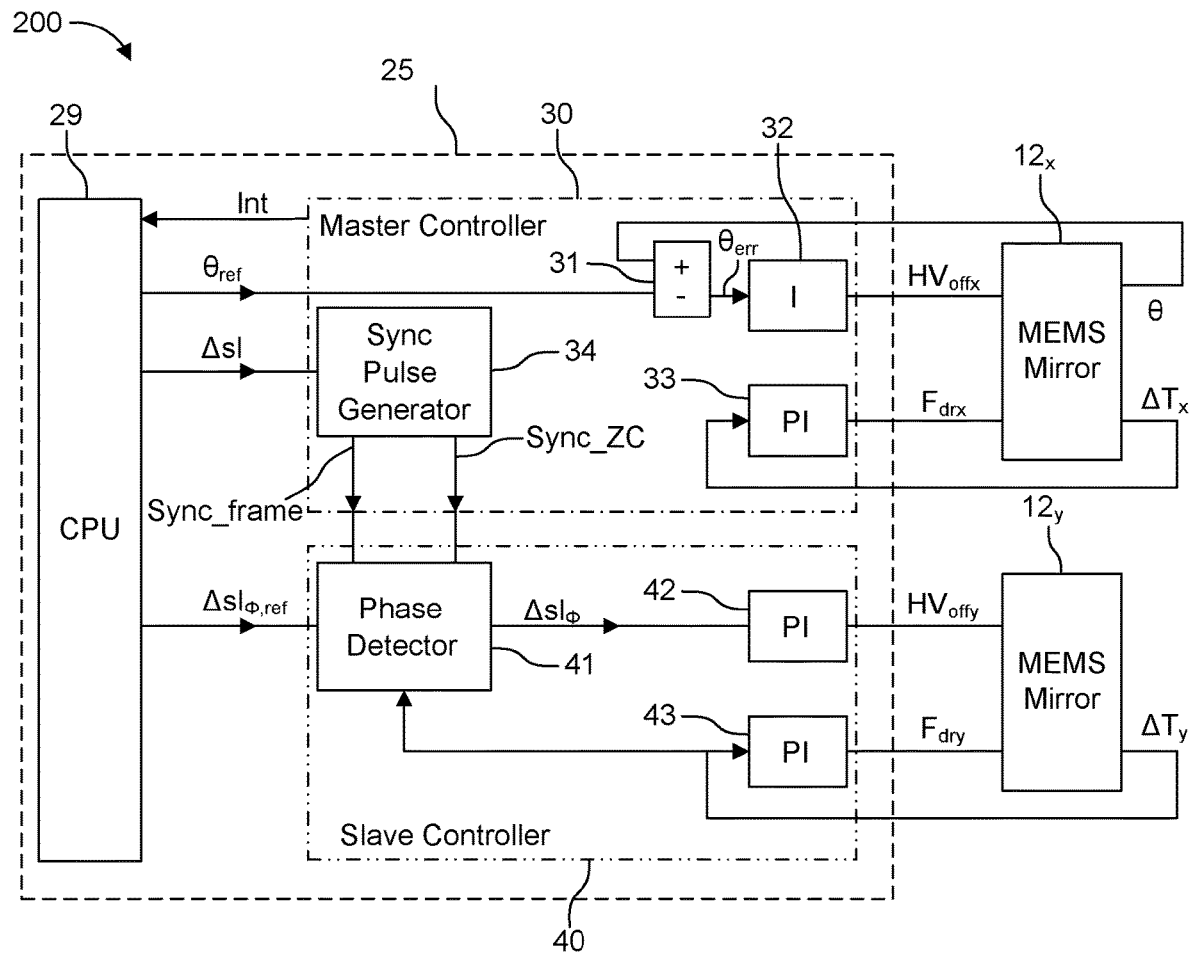
FIG. 2 is a schematic block diagram of a Lissajous scanning system in accordance with one or more embodiments.

FIG. 2 is a schematic block diagram of a Lissajous scanning system 200 in accordance with one or more embodiments. The Lissajous scanning system 200 is a dual MEMS mirror system that includes a first MEMS mirror 12x and a second MEMS mirror 12y. The first MEMS mirror 12x is configured as a master and the second MEMS mirror 12y is configured as a slave that is controlled by the control circuitry of the master. However, this arrangement is interchangeable and the second MEMS mirror 12y may be configured as the master and the first MEMS mirror 12x may be configured as the slave. For example, MEMS mirror 12x may be replaced by MEMS mirror 12y and vice versa in the figure.

The first MEMS mirror 12x includes a first scanning axis that enables the first MEMS mirror 12x to steer a light beam in an x-direction in the field-of-view. The second MEMS mirror 12y includes a second scanning axis that enables the second MEMS mirror 12y to steer a light beam in a y-direction in the field of view. Thus, the first and second scanning axes are arranged orthogonal to each other. In this example, the field-of-view can be represented by an X-Y plane and, together, the two MEMS mirrors 12x and 12y are used to steer a light beam at different x-y coordinates of the X-Y plane according to a Lissajous scanning pattern that provides a scan of the full field-of-view. A single completion of the Lissajous scanning pattern may be referred to as a scan or a frame and the duration to complete one iteration of the Lissajous scanning pattern defines the Lissajous frame rate. For each frame, the Lissajous scanning pattern may be repeated or a different Lissajous scanning pattern may be applied. Furthermore, the Lissajous scanning pattern may be altered within a frame, for example, for object tracking.

The Lissajous scanning system 200 further includes MEMS driver 25 that measures feedback information such as rotation angle $\Theta$ (i.e., angle amplitude $\Theta$) and/or PLL phase error $\Delta T$ of a MEMS mirror. A PLL phase error $\Delta T$ is the phase error between the driving frequency and the measured mirror frequency (i.e., the actual mirror oscillation). The MEMS driver 25 includes a controller 29 (e.g., a central processing unit (CPU)), a master controller 30 that controls MEMS mirror 12x, and a slave controller 40 that controls MEMS mirrors 12y based on control signals received from the master controller 30. In particular, master controller 30 controls the MEMS mirror 12x to the amplitude given by $\Theta$ref using the feedback signals and provides synchronization signals for the slave controller 40. The slave controller 40 controls the MEMS mirror 12y using the feedback signals, the synchronization signals, and a phase modulation signal $\Delta$sl$\phi$,ref provided by the controller 29.

HVoffx and HVoffy are timing parameters of the driving signals for MEMS mirrors 12x and 12y, respectively. In this case, the driving signals are regulated by defining drive voltage off time of the pulsed HV on/off signal between on pulses. In other words, HVoffx and HVoffy are used to control and modulate the duty cycle of a corresponding driving signal HV on/off.

The controller 29 is configured to generate a reference amplitude signal $\Theta$ref that defines a reference angle amplitude for the master MEMS mirror 12x. The reference amplitude signal $\Theta$ref is a constant value at which the master MEMS mirror 12x should operate.

The controller 29 is further configured to generate a constant phase shift signal $\Delta$sl per oscillation period to generate a Lissajous pattern. The oscillation period is defined by a time interval between two consecutive zero-crossing events. The constant phase shift signal $\Delta$sl represents a linearly changing phase shift value (difference) between driving (scanning) frequencies $f_{drx}$ and $f_{dry}$ of the master MEMS mirror 12x and the slave MEMS mirror 12y, respectively. For example, the phase shift between driving frequencies $f_{drx}$ and $f_{dry}$ may increase by $\Delta$sl on a per oscillation period basis. Thus, for example, the phase difference between driving frequencies $f_{drx}$ and $f_{dry}$ may linearly increase during a first oscillation period such that the driving frequencies $f_{drx}$ and $f_{dry}$ are phase shifted with respect to each other by an amount of Δsl at their respective first oscillation periods. The phase difference between driving frequencies $f_{drx}$ and $f_{dry}$ may continue to linearly increase during a second oscillation period such that at their respective second oscillation periods (i.e., a first full mirror oscillation period), the driving frequencies $f_{drx}$ and $f_{dry}$ are phase shifted with respect to each other by 2Δsl. This, linearly increasing phase shift continues for each oscillation period with an increase of Δsl for each iteration.

Figure 3:
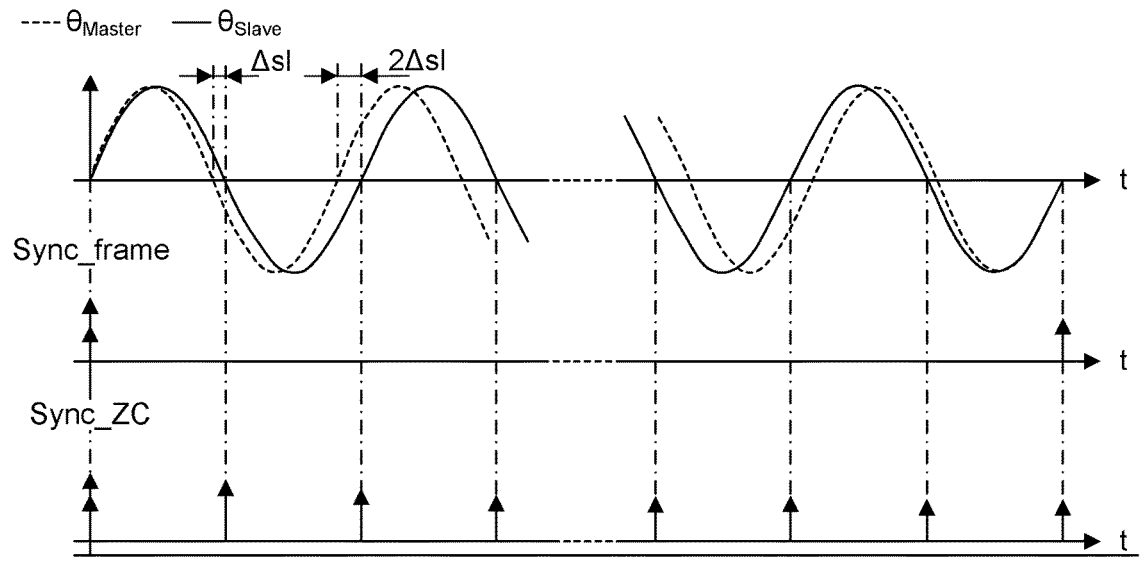
FIG. 3 illustrates a waveform diagrams over one Lissajous frame period for mirror angle (top), a frame synchronization signal Sync_frame (middle), and a phase synchronization signal Sync_ZC (bottom) in accordance with one or more embodiments.

FIG. 3 illustrates waveform diagrams over one Lissajous frame period for mirror angle (top), a frame synchronization signal Sync_frame (middle), and a phase synchronization signal Sync_ZC (bottom). The mirror frequencies $fm_x$ and $fm_y$ are the frequencies at which a MEMS mirror oscillates in order to scan the field-of-view (i.e., a frequency at which the MEMS mirror oscillates about its scanning axis). It is noted that mirror frequencies are actual frequencies that may be measured and typically differ from the driving frequencies. For example, a driving frequency provides the current frequency of the driving signal HV and a driving frequency may be twice the mirror frequency in steady state. However, if there are fast changes in the driving frequency, the driving frequency and the mirror frequency may differ from this ratio.

The top diagram illustrates mirror angles that change according to corresponding mirror frequencies $fm_x$ and $fm_y$ with a linearly changing phase shift according to the constant phase shift signal Δsl. In particular, the waveforms show an oscillating angle θmaster of master MEMS mirror 12x and an oscillating angle θslave of slave MEMS mirror 12y, which further illustrate the mirror frequencies and phases of the MEMS mirrors 12x and 12y.

A linearly changing phase difference between two signals causes a frequency difference between those two signals. The slope of the linearly changing phase difference, represented by the magnitude of the value Δsl, defines the frequency difference. Thus, a smaller slope (i.e., a slower change rate) results is a smaller frequency difference and a larger slope (i.e., a faster change rate) results is a larger frequency difference.

The driving frequencies $f_{drx}$ and $f_{dry}$ are indirectly influenced at least in part by their respective driving signals HVoffx and HVoffy. Dynamically, a mirror oscillation frequency is influenced by both the driving frequency fdr and HVoff. However, in steady state, all transients are vanished and the driving frequency and twice the mirror oscillation frequency are equal and defined by HVoff. Thus, a driving signal HV defines a driving frequency $f_{dr}$ of a MEMS mirror (i.e., how fast or slow a MEMS mirror is driven to oscillate). For example, a driving signal that applies a higher driving force (e.g., with a smaller voltage off time) generates a higher driving frequency $f_{dr}$. Conversely, a driving signal that applies a lower driving force (e.g., with a larger voltage off time) generates a lower driving frequency $f_{dr}$.

In one example, the oscillating angle amplitude θmaster may be maintained with a constant frequency and phase. The phase, and consequently the frequency, of the oscillating angle amplitude θslave may be modulated according to the constant phase shift signal Δsl to produce the desired phase and frequency difference between the two driving frequencies $f_{drx}$ and $f_{dry}$. As a result of the constant phase shift signal Δsl, the Lissajous scanning pattern can be defined and adjusted.

The controller 29 is further configured to generate a phase modulation signal Δslφ,ref that defines a desired phase modulation function for modulating the scanning pattern.

The phase modulation signal Δslφ,ref may indicate that the phase modulation is a first order phase modulation, a second order phase modulation, a third order phase modulation, and so on. As a result, the frequency ratio/difference between the driving frequencies $f_{drx}$ and $f_{dry}$ can be varied during a scanning operation, for example, within a same frame of a Lissajous pattern. For example, if the phase modulation signal Δslφ,ref is 0, a standard Lissajous pattern may be obtained. However, if the phase modulation signal Δslφ,ref is modulated, the shape of the Lissajous pattern can be adjusted while the frame rate remains unchanged. Some examples are given by the first, second, and third order modulation, meaning that the phase of the slave mirror is modulated with 1, 2, or 3 times the frame rate resulting in different Lissajous patterns. However, also any other modulation can be applied. In the end, by modulating the phase of the slave mirror, the phase between master mirror and slave mirror is modulated resulting in different Lissajous patterns.

The master controller 30 includes an amplitude error detector 31, an integral (I) controller 32, and a proportional-integral (PI) controller 33). The master controller 30 is configured in amplitude angle control mode for controlling the master MEMS mirror 12x. It will be appreciated that this type of control loop is just an example implementation. It can also be any other control concept.

The amplitude error detector 31 receives the reference amplitude signal Θref and the measured angle amplitude Θ, calculates a difference therebetween representative of an amplitude error Θerr, and outputs the amplitude error Θerr to the I controller 32. The I controller 32 is configured to receive the amplitude error Θerr and regulates the driving signals HVoffx so that the amplitude error Θerr is driven to zero on average.

The PI controller 33 is configured to receive a measured PLL phase error ΔTx and regulate the driving frequency $f_{drx}$, based on the measured PLL phase error ΔTx in order to drive the measured PLL phase error ΔTx to zero. The PLL phase error ΔT is defined as a time between a measured (actual) zero-crossing of a MEMS mirror and an expected zero-crossing.

The master controller 30 further includes a synchronization (sync) pulse generator 34. The sync pulse generator 34 receives the constant phase shift signal Δsl from the controller 29 and generates synchronization pulses Sync_frame and Sync_ZC for the slave controller 40 based on the constant phase shift signal Δsl.

FIG. 3 illustrates the frame synchronization signal Sync_frame (middle) and a phase synchronization signal Sync_ZC (bottom) over one Lissajous frame period, where two consecutive synchronization pulses of the signal Sync_frame define one Lissajous frame period. Thus, each synchronization pulse of the frame synchronization signal Sync_frame indicates an end of a previous Lissajous frame period and a start of a next Lissajous frame period. Accordingly, the frame synchronization signal Sync_frame is a signal that indicates the frame start of a Lissajous pattern (i.e., a start of a Lissajous frame period). Thus, the synchronization pulse Sync_frame synchronizes the frame start of the slave MEMS mirror 12y with the frame start of the master MEMS mirror 12x.

The phase synchronization signal Sync_ZC is a signal that indicates expected zero crossings of the slave MEMS mirror 12y. Thus, the phase synchronization signal Sync_ZC synchronizes the actual slave mirror zero-crossings with expected zero-crossings based on the constant phase shift signal Δsl.

The pulses of the Sync_ZC signal indicate time instances where the slave mirror 12y should have its zero crossings in order to obtain a standard Lissajous pattern. The modulation is done on the slave controller side. An alternative implementation could do the modulation already at the master controller 30 and if the slave zero crossings are synched with the corresponding Sync_ZC pulses, a modulated Lissajous pattern is obtained.

The slave controller 40 includes a phase detector 41, a PI controller 42, and a PI controller 43. The phase detector 41 receives the frame synchronization signal Sync_frame, the phase synchronization signal Sync_ZC, the phase modulation signal $\Delta sl\phi$,ref, and a PLL phase error signal $\Delta Ty$ that indicates a difference (i.e., an error) between actual (measured) and expected zero-crossings of the slave MEMS mirror 12y.

The aim of the phase detector 41 is to measure the phase between zero-crossings of the master mirror and zero-crossings of the slave mirror In particular, the phase detector 41 calculates an actual phase difference between a phase of the master mirror oscillation and a phase of slave mirror oscillation from a desired (expected) phase difference defined by $\Delta sl$ and $\Delta sl\phi$,ref. The phase detector 41 calculates a system phase error as a difference between the actual phase difference and the expected phase difference. The phase detector 41 is configured to add the phase modulation signal $\Delta sl\phi$,ref to the calculated system phase error to generate a modulated phase error signal $\Delta sl\phi$. The phase detector 41 uses the PLL phase error $\Delta Ty$ to calculate the modulated phase error signal $\Delta sl\phi$ based on the internal timing of the slave controller. In other words, the PLL phase error $\Delta Ty$ is used in the phase detector 41 as the expected zero-crossings does not correspond to the actual zero-crossings if $\Delta Ty$ is nonzero.

The PI controller 42 receives the modulated phase error signal $\Delta sl\phi$ and uses it to control the high voltage switching off time HVoffy of the driving signal applied to the actuator of the slave MEMS mirror 12y. As a result, of modulating the driving signal of the slave MEMS mirror 12y, the mirror oscillation frequency $fm_y$ is also modulated to have a variable frequency ratio/difference during a Lissajous frame period with respect to the mirror oscillation frequency $fm_x$.

The PI controller 43 is configured to receive a measured PLL phase error $\Delta Ty$ and regulate the driving frequency $f_{dry}$ based on the measured PLL phase error $\Delta Ty$ in order to drive the measured PLL phase error $\Delta Ty$ to zero.

By modulating the phase and therefore the frequency of the scanning systems in a defined way, several scanning performance improvements can be obtained. In the following, two non-limiting example implementations are given where sine wave variations of the mirror frequencies $fm_x$ and $fm_y$ are considered. However, any phase modulation possible with the scanning system can be considered to enhance the system performance or to fulfill the desired requirements. For example, a triangular wave modulation of the driving frequency resulting from the phase modulation can be used instead of a sinusoidal or cosinusoidal wave modulation. Additionally, a modulation of a driving frequency may be linear or non-linear as a result from the phase modulation. Also, existing ideas like sub-framing can be combined with the phase modulation.

Figure 4B:
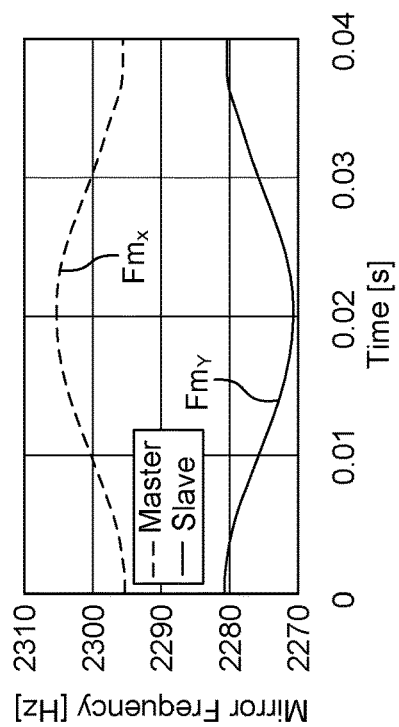
FIG. 4B illustrates waveforms for mirror frequencies fmx and fmy used in order to obtain the Lissajous scanning pattern shown in FIG. 4A in accordance with one or more embodiments.
Figure 4A:
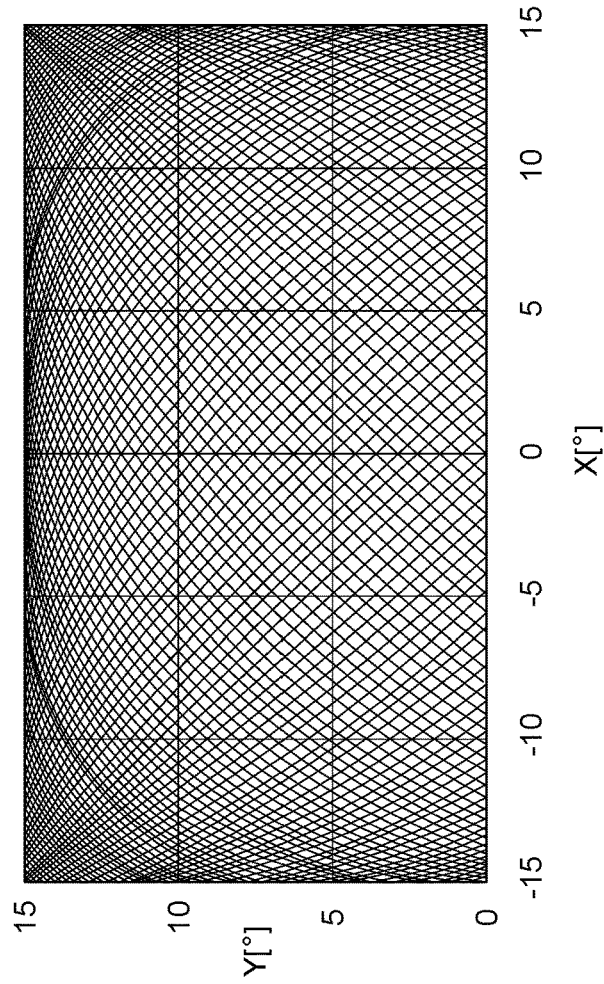
FIG. 4A illustrates an obtained Lissajous scanning pattern for one Lissajous frame period in accordance with one or more embodiments.

FIG. 4A illustrates an obtained Lissajous scanning pattern for one Lissajous frame period according to one or more embodiments. Here, only an upper half of the field-of-view is shown as the Lissajous scanning pattern is point symmetric about the center point [0, 0] (i.e., radially symmetric). For example, a point at [+10, +10] is symmetric with point at [−10, −10], and so on. In particular, the obtained Lissajous scanning pattern provides an increased pixel density at a center region of the field-of-view while the frame rate is 25 Hz.

FIG. 4B illustrates waveforms for mirror frequencies $fm_x$ and $fm_y$ used in order to obtain the Lissajous scanning pattern shown in FIG. 4A. In this example, the mirror frequencies $fm_x$ and $fm_y$ are both varied during a Lissajous frame period in a cosine manner at a frequency equal to the frame rate and opposite phase. That is, the driving frequency $f_{drx}$ (has a master initial frequency that is offset from a slave initial frequency of the driving frequency $f_{dry}$. The driving frequencies $f_{drx}$ and $f_{dry}$ are both varied during a scanning operation 180° out of phase from each other.

As shown in FIG. 4A, the frequency variation (here the variation has a frequency equal to the frame rate) between mirror frequencies $fm_x$ and $fm_y$ leads to a denser line grid in one diagonal than in the other diagonal, which is beneficially used to increase the pixel (pattern) density. As the Lissajous scanning pattern is defined by the phase relation between both scanning systems, it is also possible for only one scanning system to be changed in frequency while the other is kept constant. In other words, the mirror frequency $fm_x$ can be kept constant, while the mirror frequency $fm_x$ is offset from the mirror frequency $fm_x$ and is further modulated by a N order modulated wave (e.g., a modulated sine wave) in order to produce a frequency variation between the two mirror frequencies $fm_x$ and $fm_y$, where N is an integer greater than zero.

Figure 4C:
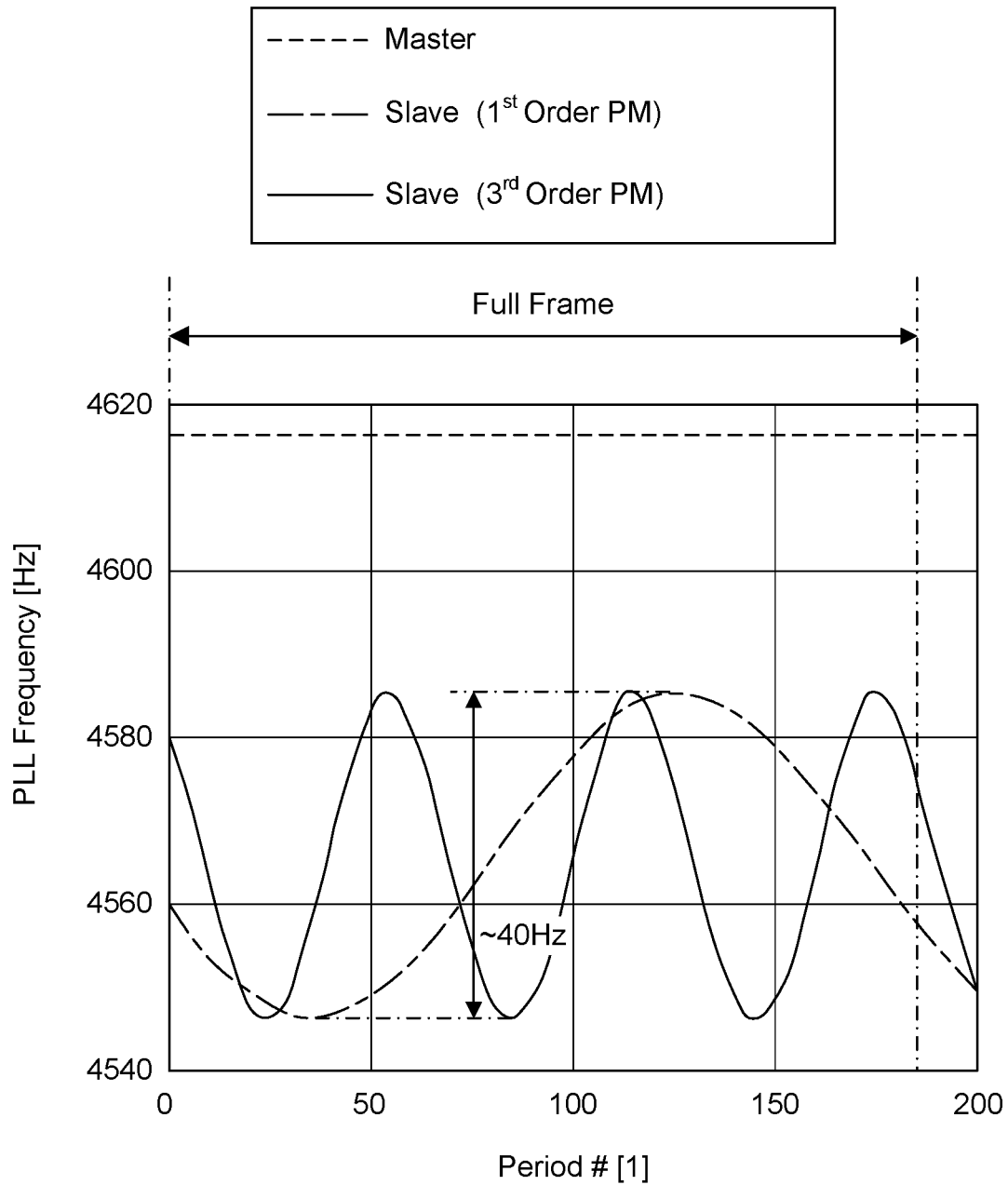
FIG. 4C illustrates mirror frequencies fmx and fmy used in order to obtain different Lissajous scanning patterns in accordance with one or more embodiments.

FIG. 4C illustrates mirror frequencies $fm_x$ and $fm_y$ used in order to obtain different Lissajous scanning patterns according to one or more embodiments. Here, the master mirror frequency $fm_x$ is maintained constant by the master controller 30, while the slave mirror frequency $fm_y$ is offset from the mirror frequency $fm_x$ and is further modulated by the slave controller 40 using an N order modulated wave (e.g., modulated sine wave) in order to produce a frequency variation between the two mirror frequencies $fm_x$ and $fm_y$, where N is an integer greater than zero. In this example, two different phase modulations are applied over one Lissajous frame period to the slave driving frequency $f_{dry}$: a first order phase modulation PM (N=1) and a third order phase modulation PM (N=3). The first order phase modulation (N=1) may be used to obtain the Lissajous scanning pattern shown in FIG. 4A, while the third order phase modulation (N=3) may be used to further increase the pixel (pattern) density. Thus, the phase modulation PM applied to one of the driving frequencies is used to produce a frequency variation between the two mirror frequencies $fm_x$ and $fm_y$.

Figure 5:
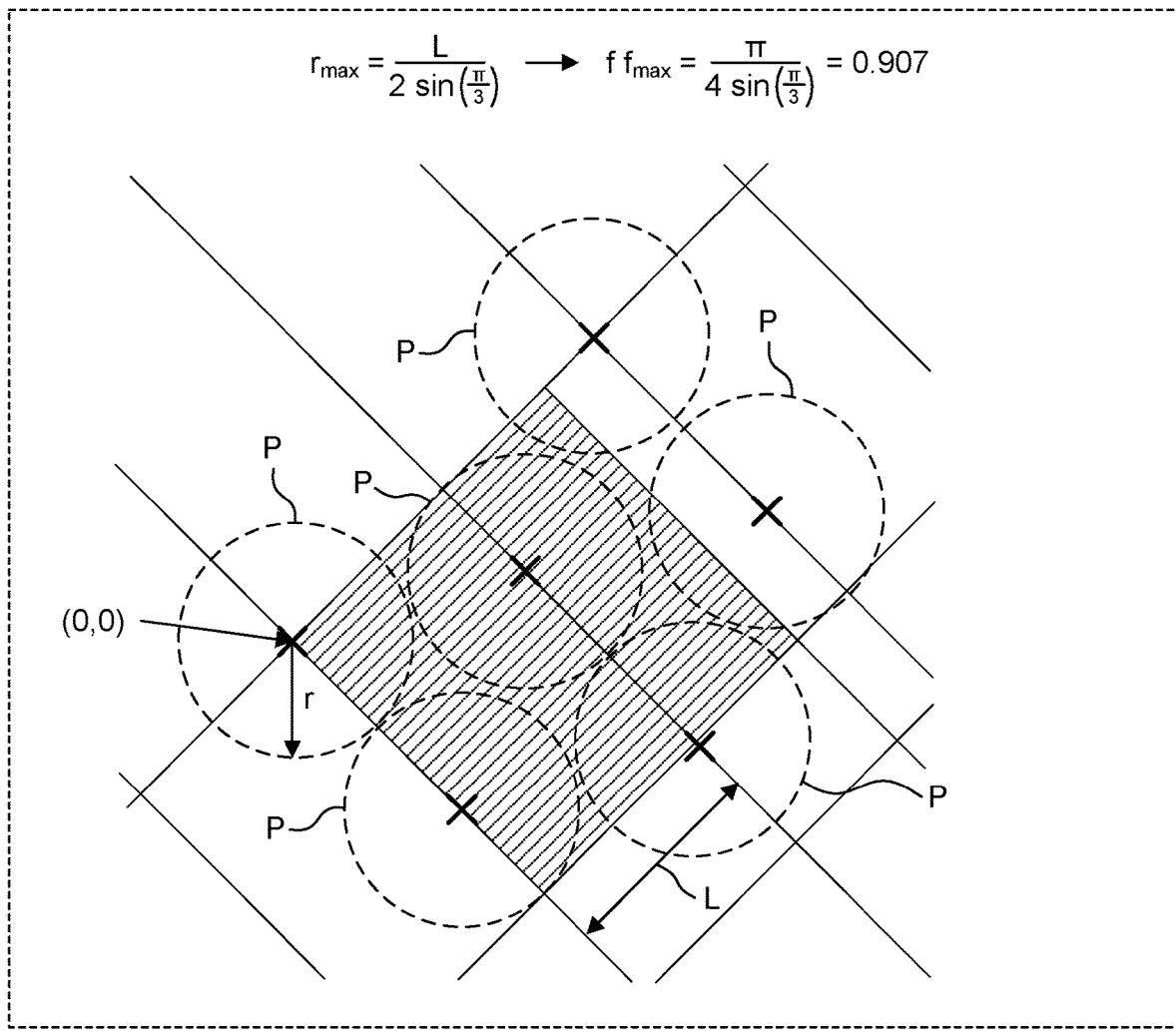
FIG. 5 shows a pixel distribution according to hexagonal patterning in accordance with one or more embodiments.

In addition to generating a frequency variation between the two mirror frequencies, a hexagonal pixel distribution may be used to further increase the resolution of the pixel grid (i.e., of the Lissajous scanning pattern). FIG. 5 shows a pixel distribution according to hexagonal patterning according to one or more embodiments. Each pixel p respects a laser shot into the field-of-view having a radius r and distance L that define a pixel size and spacing. The hexagonal patterning results in a highest possible fill factor. By using the proposed sine wave frequency modulation applied to one or more driving frequencies and hexagonal patterning, the fill factor can be increased to 90.7%.

Another possibility is to increase the Lissajous scanning pattern resolution at a specific region-of-interest (ROI) in the field-of-view during a Lissajous frame period. That is, the phase/frequency modulation itself can be altered during a scanning operation within a Lissajous frame period.

Figure 6A:
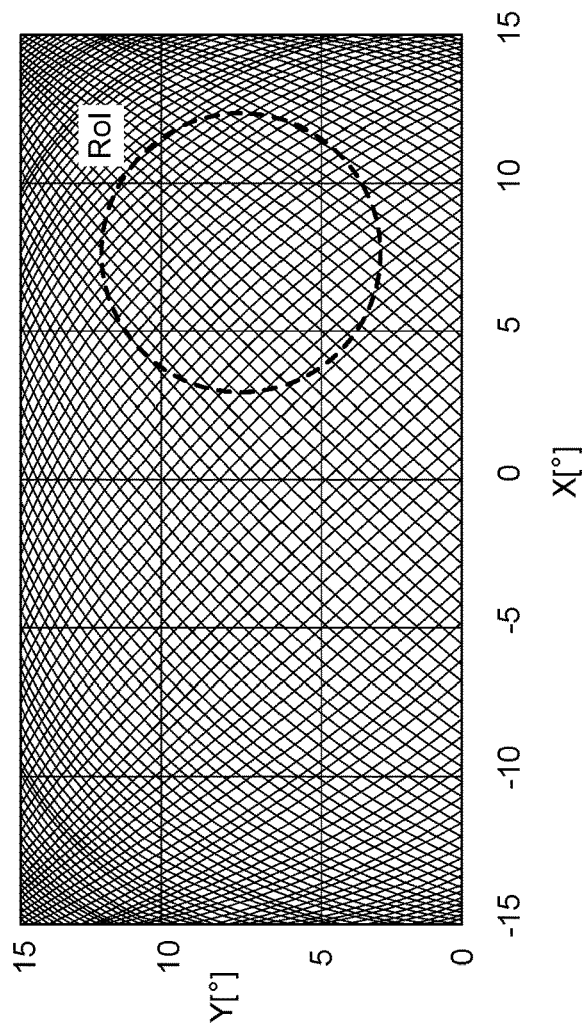
FIG. 6A illustrates an obtained Lissajous scanning pattern for one Lissajous frame period in accordance with one or more embodiments.

FIG. 6A illustrates an obtained Lissajous scanning pattern for one Lissajous frame period according to one or more embodiments. Similar to FIG. 4A, only an upper half of the field-of-view is shown as the Lissajous scanning pattern is point symmetric about the center point [0, 0]. The obtained Lissajous scanning pattern shown in FIG. 6A provides an increased pixel density at an ROI while the frame rate is 25 Hz. In particular, the upper right quadrant of the field-of-view includes an ROI that has a denser scanning line grid compared to the upper left quadrant of the field-of view. As the Lissajous pattern is symmetric about the center point, the lower left quadrant (not illustrated) also has a high-resolution grid. This pattern is generated by modulating the scanning frequencies with a frequency three times the frame rate and opposite phase. By a specific phase modulation, the ROI can be moved over the field-of-view in order to, for example, track an object or to mimic a human eye.

The controller 29 may modify the phase modulation signal Δslφ,ref so that the frequency variation (ratio) between the two mirror frequencies is changed within a specific ROI in comparison to an area outside the ROI (i.e., at least two different functions indicated by the phase modulation signal Δslφ,ref are used during a single Lissajous frame period). For example, two different slopes or phase gradients defined by the phase modulation signal Δslφ,ref, corresponding to two different offset frequencies that still produce a 25 Hz frame rate, are used at different areas of the scanning pattern. Here, the master controller 30, for example, implemented with a field programmable gate array (FPGA), provides an interrupt Int to the controller 29 at each PLL period. Therefore, the controller 29 knows which phase modulation value Δslφ,ref to apply. The phase modulation signal Δslφ,ref has 182 possible entries or values the controller 29 selects from, where each entry corresponds to the number of slave PLL periods per Lissajous frame. The controller 29 applies the phase modulation value Δslφ,ref to the slave controller 40 according to the number of PLL periods elapsed since the last frame start (i.e., frame sync). The number of possible entries or values of phase modulation value Δslφ,ref is configurable.

Figure 6B:
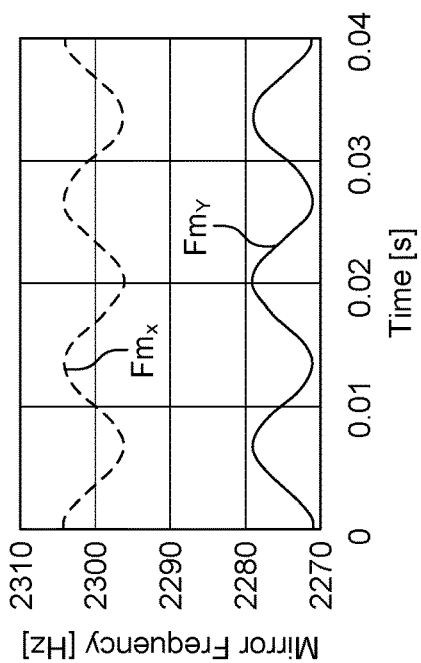
FIG. 6B illustrates waveforms for mirror frequencies fmx and fmy used in order to obtain the Lissajous scanning pattern shown in FIG. 6A in accordance with one or more embodiments.

FIG. 6B illustrates waveforms for mirror frequencies $fm_x$ and $fm_y$ used in order to obtain the Lissajous scanning pattern shown in FIG. 6A. In this example, the mirror frequencies $fm_x$ and $fm_y$ are both varied during a Lissajous frame period in a cosine manner at a frequency three times the frame rate and opposite phase. That is, the mirror frequency $fm_x$ has a master initial frequency that is offset from a slave initial frequency of the mirror frequency $fm_y$. The mirror frequencies $fm_x$ and $fm_y$ are both varied during a scanning operation 180° out of phase from each other. As noted above, the Lissajous scanning pattern is defined by the phase relation between both scanning systems, it is also possible for only one scanning system to be changed in frequency while the other is kept constant. FIG. 4C illustrates an example of this by using third order phase modulation (N=3) applied to the slave mirror frequency $fm_y$ while the master mirror frequency $fm_x$ is maintained constant.

In view of the above-described embodiments, the resolution (i.e., pixel density) of a Lissajous scanning pattern can be increased or decreased frame-by-frame or during a same Lissajous frame while maintaining a constant frame rate. The above-described embodiments extend the Lissajous scanning concept where two scanning systems or two axes of one 2D scanning system are used to deflect the light beam into X and Y directions, by a phase modulation between both scanning axes. The two driving frequencies may be offset from each other, but not necessarily so, and the phase modulation of at least one of the driving frequencies is used to generate a variable frequency ratio between the two driving frequency that continuously varies over time (e.g., as shown in FIGS. 4B, 4C, and 6B). This provides a more flexible design of the scanning pattern, allowing for example a better resolution at the center, a more evenly distributed resolution, or the possibility to define specific ROIs with increased resolution. Using this concept, the frame rate is kept constant.

Although embodiments described herein relate to a MEMS device with a mirror, it is to be understood that other implementations may include optical devices other than MEMS mirror devices, including other oscillating structures, including those not related to LIDAR. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer, or an electronic circuit. In some embodiments, some one or more of the method steps may be executed by such an apparatus.

It is further to be noted that methods disclosed in the specification or in the claims may be implemented by a device having means for performing each of the respective acts of these methods. Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application-specific integrated circuits (ASICs), field programmable logic arrays (FPGAs), programmable logic controller (PLC), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. A control unit may use electrical signals and digital algorithms to perform its receptive, analytic, and control functions, which may further include corrective functions. Such hardware, software, and firmware may be implemented within the same device or within separate devices to support the various techniques described in this disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Although various embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. An oscillator system, comprising:
a first oscillator structure configured to oscillate about a first rotation axis at a first oscillation frequency;
a second oscillator structure configured to oscillate about a second rotation axis at a second oscillation frequency; and
a driver circuit configured to generate a first driving signal to drive an oscillation of the first oscillator structure with a first oscillation phase and the first oscillation frequency, and generate a second driving signal to drive an oscillation of the second oscillator structure with a second oscillation phase and the second oscillation frequency,
wherein the first oscillation frequency and the second oscillation frequency have a variable frequency ratio with respect to each other that varies over time,
wherein the driver circuit is configured to modulate at least one of the first oscillation phase or the second oscillation phase to modulate the variable frequency ratio.

2. The oscillator system of claim 1, wherein the driver circuit comprises a master control circuitry configured to generate the first driving signal and generate at least one synchronization signal, and a slave control circuitry configured to generate the second driving signal based on the at least one synchronization signal.

3. The oscillator system of claim 2, wherein the at least one synchronization signal includes a frame synchronization signal configured to synchronize a start of a frame period for both the first oscillator structure and the second oscillator structure.

4. The oscillator system of claim 2, wherein the at least one synchronization signal includes a phase synchronization signal configured to synchronize a rotation angle of the oscillation of the second oscillator structure with expected zero-crossing times.

5. The oscillator system of claim 4, wherein:
the master control circuit is configured to receive a constant phase shift parameter and generate the phase synchronization signal based on the constant phase shift parameter.

6. The oscillator system of claim 5, wherein the slave control circuitry is configured to continuously phase shift the expected zero-crossing times of the second oscillator structure with respect to expected zero-crossing times of the first oscillator structure over a frame period based on the phase synchronization signal.

7. The oscillator system of claim 5, wherein the slave control circuitry is configured to constantly change a phase shift of the oscillation of the second oscillator structure with respect to the oscillation of the first oscillator structure based on the phase synchronization signal.

8. The oscillator system of claim 4, wherein:
the slave control circuitry comprises a phase detector,
wherein the phase detector is configured to receive the phase synchronization signal, a phase error corresponding to an error in zero-crossing times of the oscillation of the second oscillator structure, and a phase modulation signal indicating a phase modulation, and generate a modulated phase error signal based thereon,
wherein the slave control circuitry is configured to modulate a duty cycle of the second driving signal based on the modulated phase error signal.

9. The oscillator system of claim 8, wherein the phase detector is configured to measure an actual phase difference between the first oscillation phase and the second oscillation phase, calculate a system phase error between the actual phase difference and an expected phase difference between the first oscillation phase and the second oscillation phase, and add the phase modulation signal to the system phase error to generate the modulated phase error signal.

10. The oscillator system of claim 1, wherein the driver circuit is configured to modulate a duty cycle of the second driving signal in order to modulate the second oscillation phase.

11. The oscillator system of claim 10, wherein the driver circuit is configured to modulate the duty cycle of the second driving signal to induce a periodic variance on the second oscillation frequency such that the second oscillation frequency varies over a frame period.

12. The oscillator system of claim 11, wherein the periodic variance is continuous.

13. The oscillator system of claim 11, wherein the periodic variance is a sine wave or a triangle wave.

14. The oscillator system of claim 1, wherein:
the driver circuit is configured to modulate a duty cycle of the first driving signal in order to modulate the first oscillation phase, and
the driver circuit is configured to modulate a duty cycle of the second driving signal in order to modulate the second oscillation phase.

15. The oscillator system of claim 14, wherein:
the driver circuit is configured to modulate the duty cycle of the first driving signal to induce a first periodic variance on the first oscillation frequency such that the first oscillation frequency varies over a frame period, and
the driver circuit is configured to modulate the duty cycle of the second driving signal to induce a second periodic variance on the second oscillation frequency such that the second oscillation frequency varies over the frame period,
wherein the first periodic variance and the second periodic variance are waveforms having a same frequency with opposite phases.

16. The oscillator system of claim 1, wherein:
the oscillator system is a Lissajous scanning system configured to scan a field-of-view, and
the first oscillator structure and the second oscillator structure are configured to generate a Lissajous scanning pattern via respective oscillations.

17. The oscillator system of claim 16, wherein the Lissajous scanning pattern has a hexagonal pixel distribution pattern.

18. A method of controlling an oscillator system, comprising:
driving a first oscillator structure to oscillate about a first rotation axis at a first oscillation frequency;
driving a second oscillator structure to oscillate about a second rotation axis at a second oscillation frequency;
generating a first driving signal to drive an oscillation of the first oscillator structure with a first oscillation phase and the first oscillation frequency;
generating a second driving signal to drive an oscillation of the second oscillator structure with a second oscillation phase and the second oscillation frequency, wherein the first oscillation frequency and the second oscillation frequency have a variable frequency ratio with respect to each other that varies over time; and
modulating at least one of the first oscillation phase or the second oscillation phase to modulate the variable frequency ratio.

19. An oscillator system, comprising:
an oscillator structure configured to oscillate about a first rotation axis at a first oscillation frequency and oscillate about a second rotation axis at a second oscillation frequency; and
a driver circuit configured to generate a first driving signal to drive a first oscillation of the oscillator structure about the first rotation axis with a first oscillation phase and the first oscillation frequency, and generate a second driving signal to drive a second oscillation of the oscillator structure about the second rotation axis with a second oscillation phase and the second oscillation frequency,
wherein the first oscillation frequency and the second oscillation frequency have a variable frequency ratio with respect to each other that varies over time,
wherein the driver circuit is configured to modulate at least one of the first oscillation phase or the second oscillation phase to modulate the variable frequency ratio.

20. The oscillator system of claim 19, wherein the driver circuit comprises a master control circuitry configured to generate the first driving signal and generate at least one synchronization signal, and a slave control circuitry configured to generate the second driving signal based on the at least one synchronization signal.

21. The oscillator system of claim 20, wherein the at least one synchronization signal includes a frame synchronization signal configured to synchronize a start of a frame period for both the first oscillation and the second oscillation.

22. The oscillator system of claim 20, wherein the at least one synchronization signal includes a phase synchronization signal configured to synchronize a rotation angle of the second oscillation with expected zero-crossing times.

23. The oscillator system of claim 22, wherein:
the master control circuit is configured to receive a constant phase shift parameter and generate the phase synchronization signal based on the constant phase shift parameter.

24. The oscillator system of claim 23, wherein the slave control circuitry is configured to continuously phase shift the expected zero-crossing times of the second oscillation with respect to expected zero-crossing times of the first oscillation over a frame period based on the phase synchronization signal.

25. The oscillator system of claim 23, wherein the slave control circuitry is configured to constantly change a phase shift of the second oscillation with respect to the first oscillation based on the phase synchronization signal.

26. The oscillator system of claim 22, wherein:
the slave control circuitry comprises a phase detector,
wherein the phase detector is configured to receive the phase synchronization signal, a measurement signal indicating measured zero-crossing times of the second oscillation, and a phase modulation signal indicating a phase modulation, and generate a modulated phase error signal based thereon
wherein the slave control circuitry is configured to modulate a duty cycle of the second driving signal based on the modulated phase error signal.

27. The oscillator system of claim 19, wherein the driver circuit is configured to modulate a duty cycle of the second driving signal in order to modulate the second oscillation phase.

28. The oscillator system of claim 27, wherein the driver circuit is configured to modulate the duty cycle of the second driving signal to induce a periodic variance on the second oscillation frequency such that the second oscillation frequency varies over a frame period.

29. The oscillator system of claim 28, wherein the periodic variance is continuous.

30. The oscillator system of claim 28, wherein the periodic variance is a sine wave or a triangle wave.

31. The oscillator system of claim 19, wherein:
the driver circuit is configured to modulate a duty cycle of the first driving signal in order to modulate the first oscillation phase, and
the driver circuit is configured to modulate a duty cycle of the second driving signal in order to modulate the second oscillation phase.

32. The oscillator system of claim 31, wherein:
the driver circuit is configured to modulate the duty cycle of the first driving signal to induce a first periodic variance on the first oscillation frequency such that the first oscillation frequency varies over a frame period, and
the driver circuit is configured to modulate the duty cycle of the second driving signal to induce a second periodic variance on the second oscillation frequency such that the second oscillation frequency varies over the frame period,
wherein the first periodic variance and the second periodic variance are waveforms having a same frequency with opposite phases.

33. The oscillator system of claim 19, wherein:
the oscillator system is a Lissajous scanning system configured to scan a field-of-view, and
the first oscillation and the second oscillation are configured to generate a Lissajous scanning pattern via respective oscillations.

34. The oscillator system of claim 33, wherein the Lissajous scanning pattern has a hexagonal pixel distribution pattern.

35. A method of controlling an oscillator structure, comprising:
driving the oscillator structure to oscillate about a first rotation axis at a first oscillation frequency and to oscillate about a second rotation axis at a second oscillation frequency;

generating a first driving signal to drive a first oscillation of the oscillator structure about the first rotation axis with a first oscillation phase and the first oscillation frequency;

generating a second driving signal to drive a second oscillation of the oscillator structure about the second rotation axis with a second oscillation phase and the second oscillation frequency, wherein the first oscillation frequency and the second oscillation frequency have a variable frequency ratio with respect to each other that varies over time; and modulating at least one of the first oscillation phase or the second oscillation phase to modulate the variable frequency ratio.

* * * * *